United States Patent
Nakaiso

(10) Patent No.: US 10,916,938 B2
(45) Date of Patent: Feb. 9, 2021

(54) ESD-PROTECTIVE SURFACE-MOUNT COMPOSITE COMPONENT

(71) Applicant: Murata Manufacturing Co., Ltd., Nagaokakyo (JP)

(72) Inventor: Toshiyuki Nakaiso, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 299 days.

(21) Appl. No.: 16/229,115

(22) Filed: Dec. 21, 2018

(65) Prior Publication Data
US 2019/0123554 A1 Apr. 25, 2019

Related U.S. Application Data

(63) Continuation of application No. PCT/JP2017/026756, filed on Jul. 25, 2017.

(30) Foreign Application Priority Data

Aug. 1, 2016 (JP) .................. 2016-150964

(51) Int. Cl.
*H02H 9/04* (2006.01)
*H01F 17/00* (2006.01)
(Continued)

(52) U.S. Cl.
CPC .......... *H02H 9/045* (2013.01); *H01F 17/0013* (2013.01); *H01L 27/0248* (2013.01);
(Continued)

(58) Field of Classification Search
CPC .......... H02H 9/04; H02H 9/045; H02H 9/046; H01L 25/16; H01L 27/0248; H01L 28/60;
(Continued)

(56) References Cited

U.S. PATENT DOCUMENTS 9,532,454 B2 12/2016 Block et al.
2006/0077646 A1 4/2006 Ann et al.
(Continued)

FOREIGN PATENT DOCUMENTS

JP  H0428409 A  1/1992
JP  H0595031 U  12/1993
(Continued)

OTHER PUBLICATIONS

International Seach Report issued in PCT/JP2017/026756, dated Oct. 17, 2017.
(Continued)

Primary Examiner — Kevin J Comber
(74) Attorney, Agent, or Firm — Arent Fox LLP

(57) ABSTRACT

An ESD-protective surface-mount composite component that includes a surface-mount inductor and a thin-film component. The surface-mount inductor includes a body, a first outer conductor and a second outer conductor individually formed at both ends of the body in a first direction, and a third outer conductor formed at an intermediate position of the body in the first direction. The thin-film component includes a flat plate-like body, an ESD protection element formed inside the body, a first terminal conductor connected to the ESD protection element and formed on a front surface of the body, and a second terminal conductor connected to the ESD protection element and formed on the front surface of the body. The first terminal conductor is joined to the first outer conductor, and the second terminal conductor is joined to the third outer conductor.

20 Claims, 9 Drawing Sheets

(51) Int. Cl.
  *H01L 27/02*   (2006.01)
  *H01L 49/02*   (2006.01)
  *H03H 7/01*    (2006.01)
  *H01F 27/29*   (2006.01)
  *H01L 25/16*   (2006.01)

(52) U.S. Cl.
  CPC ............... *H01L 28/60* (2013.01); *H02H 9/04* (2013.01); *H03H 7/0115* (2013.01); *H01F 27/292* (2013.01); *H01F 2017/0026* (2013.01); *H01L 25/16* (2013.01)

(58) Field of Classification Search
  CPC . H03H 7/0115; H01F 17/0013; H01F 27/292; H01F 2017/0026
  USPC .......................................................... 361/56
  See application file for complete search history.

(56) References Cited

U.S. PATENT DOCUMENTS

2007/0076392 A1* 4/2007 Urashima ............... H01L 24/81
  361/763
2008/0309442 A1* 12/2008 Hebert .................. H01L 23/645
  336/65
2009/0035560 A1  2/2009 Block et al.
2017/0236634 A1  8/2017 Block et al.

FOREIGN PATENT DOCUMENTS

| | | |
|---|---|---|
| JP | H09135140 A | 5/1997 |
| JP | 2000252131 A | 9/2000 |
| JP | 2006115460 A | 4/2006 |
| JP | 2007214166 A | 8/2007 |
| JP | 2008054055 A | 3/2008 |
| JP | 2009522792 A | 6/2009 |
| JP | 5704291 B1 | 4/2015 |
| WO | 2011152256 A1 | 12/2011 |

OTHER PUBLICATIONS

Written Opinion of the International Searching Authority issued in PCT/JP2017/026756, dated Oct. 17, 2017.

* cited by examiner

ESD-PROTECTIVE SURFACE-MOUNT COMPOSITE COMPONENT

CROSS REFERENCE TO RELATED APPLICATIONS

The present application is a continuation of PCT/JP2017/026756 filed Jul. 25, 2017, which claims priority to Japanese Patent Application No. 2016-150964, filed Aug. 1, 2016, the entire contents of each of which are incorporated herein by reference.

TECHNICAL FIELD

The present disclosure relates to a surface-mount composite component with an ESD protection function (or ESD-protective surface-mount composite component) including a diode and an inductor.

BACKGROUND

To prevent damage to, and malfunction of, electronic devices caused by electro-static discharge (ESD), various ESD protection circuits have been conventionally used.

For example, a radio transmitter disclosed in Patent Document 1 (identified below) includes an ESD protection circuit between an antenna terminal and a transmitting circuit and a receiving circuit (hereinafter collectively referred to as a transmitting and receiving circuit). The ESD protection circuit has a filter function as well as the ESD protection function.

In addition, the ESD protection circuit includes an inductor, a varistor, and capacitors. The inductor is connected between the transmitting and receiving circuit and the antenna terminal. The varistor is connected between one terminal of the inductor and the ground. One of the capacitors is connected between the other terminal of the inductor and the ground, and the other capacitor is connected in parallel to the inductor.

In ESD protection circuits with such a circuit configuration, an inductor, a varistor, and a capacitor have conventionally been separate surface-mount components. The inductor, the varistor, and the capacitor are individually mounted on a base circuit board (printed wiring board).

Patent Document 1: Japanese Unexamined Patent Application Publication No. 2008-54055.

With the conventional ESD protection circuit configuration such as that described above, the ESD protection circuit requires a large space, because its circuit elements are separate surface-mount components individually mounted on the base circuit board. Since the inductor, the varistor, and the capacitor are connected by a routing conductor on the base circuit board, the ESD protection circuit may not be able to achieve desired characteristics of a filter circuit.

SUMMARY OF THE INVENTION

Accordingly, an object of the present invention is to provide an ESD-protective surface-mount composite component that provides desired characteristics and also achieves a compact size compared with conventional designs.

Accordingly, an ESD-protective surface-mount composite component is disclosed according to an exemplary embodiment that includes a surface-mount inductor and a thin-film component. The surface-mount inductor includes a rectangular-parallelepiped-shaped body containing a magnetic material, an inductor conductor formed inside the body, a first outer conductor and a second outer conductor connected to the inductor conductor and individually formed at both ends of the body in a first direction. Moreover, a third outer conductor is formed at an intermediate position of the body in the first direction. The thin-film component includes a flat plate-like body, an ESD protection element formed inside the body, a first terminal conductor connected to a first terminal of the ESD protection element and formed on a front surface of the body, and a second terminal conductor connected to a second terminal of the ESD protection element and formed on the front surface of the body. The thin-film component is mounted on a first surface of the body parallel to the first direction in such a manner that the first terminal conductor is connected to the first outer conductor and the second terminal conductor is connected to the third outer conductor.

In the configuration described above, the thin-film component is directly mounted on the inductor. Advantageously, this configuration eliminates the need for a routing conductor that connects the thin-film component and the inductor mounted on the routing conductor. Without the routing conductor, there is no impact of inductance of the routing conductor on characteristics.

In the ESD-protective surface-mount composite component according to another exemplary aspect, a parasitic capacitor of the ESD protection element and the inductor may form a filter.

With this configuration, a filter can be realized with a simple configuration.

For, the ESD-protective surface-mount composite component another exemplary aspect, the thin-film component includes a capacitor formed inside the body and a third terminal conductor formed on the front surface of the body. A first counter electrode of the capacitor is connected to the second terminal conductor, and a second counter electrode of the capacitor is connected to the third terminal conductor. The third terminal conductor is mounted on the second outer conductor.

With this configuration, where a capacitor is formed inside the thin-film component, a desired capacitance is easily achievable.

In the ESD-protective surface-mount composite component according to another exemplary aspect, the capacitor, a parasitic capacitor of the ESD protection element, and the inductor may form a filter.

With this configuration, a filter including a capacitor having a desired capacitance is easily realized with a simple configuration.

For the ESD-protective surface-mount composite component according to another exemplary aspect, an area of the thin-film component is smaller than an area of the first surface, and as viewed in a direction orthogonal to the first surface, the thin-film component overlaps the first surface.

With this configuration, the plane area of the ESD-protective surface-mount composite component is equal to the plane area of the surface-mount inductor. The ESD-protective surface-mount composite component is thus compact in size.

For the ESD-protective surface-mount composite component according to another exemplary aspect, an area of the thin-film component is larger than an area of the first surface, and as viewed in a direction orthogonal to the first surface, the thin-film component overlaps the first surface.

In this configuration, the plane area of the ESD-protective surface-mount composite component is larger than the plane area of the surface-mount inductor. However, this improves efficiency in producing ESD-protective surface-mount composite components, because inductors can be joined to an array of thin-film components formed in a motherboard.

Advantageous Effects of Invention

The exemplary embodiments of the present invention provide a compact ESD-protective surface-mount composite component that can achieve desired characteristics.

DETAILED DESCRIPTION OF EXEMPLARY EMBODIMENTS

Figure 1:
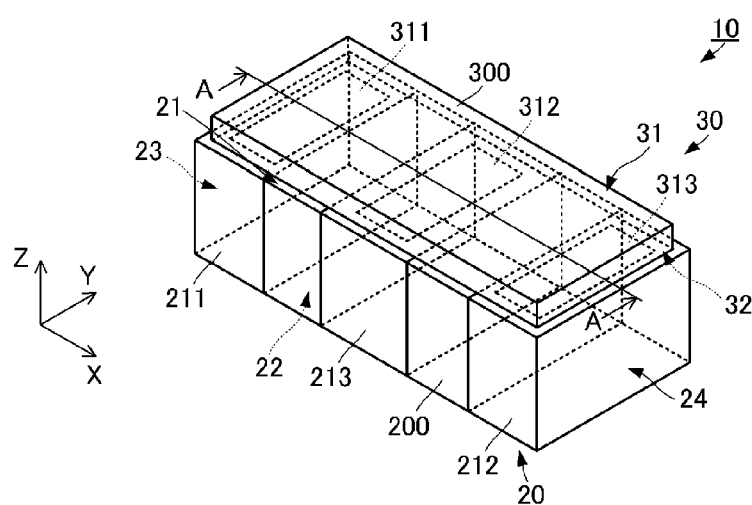
FIG. 1 is an external perspective view of an ESD-protective surface-mount composite component according to a first exemplary embodiment.
Figure 2:
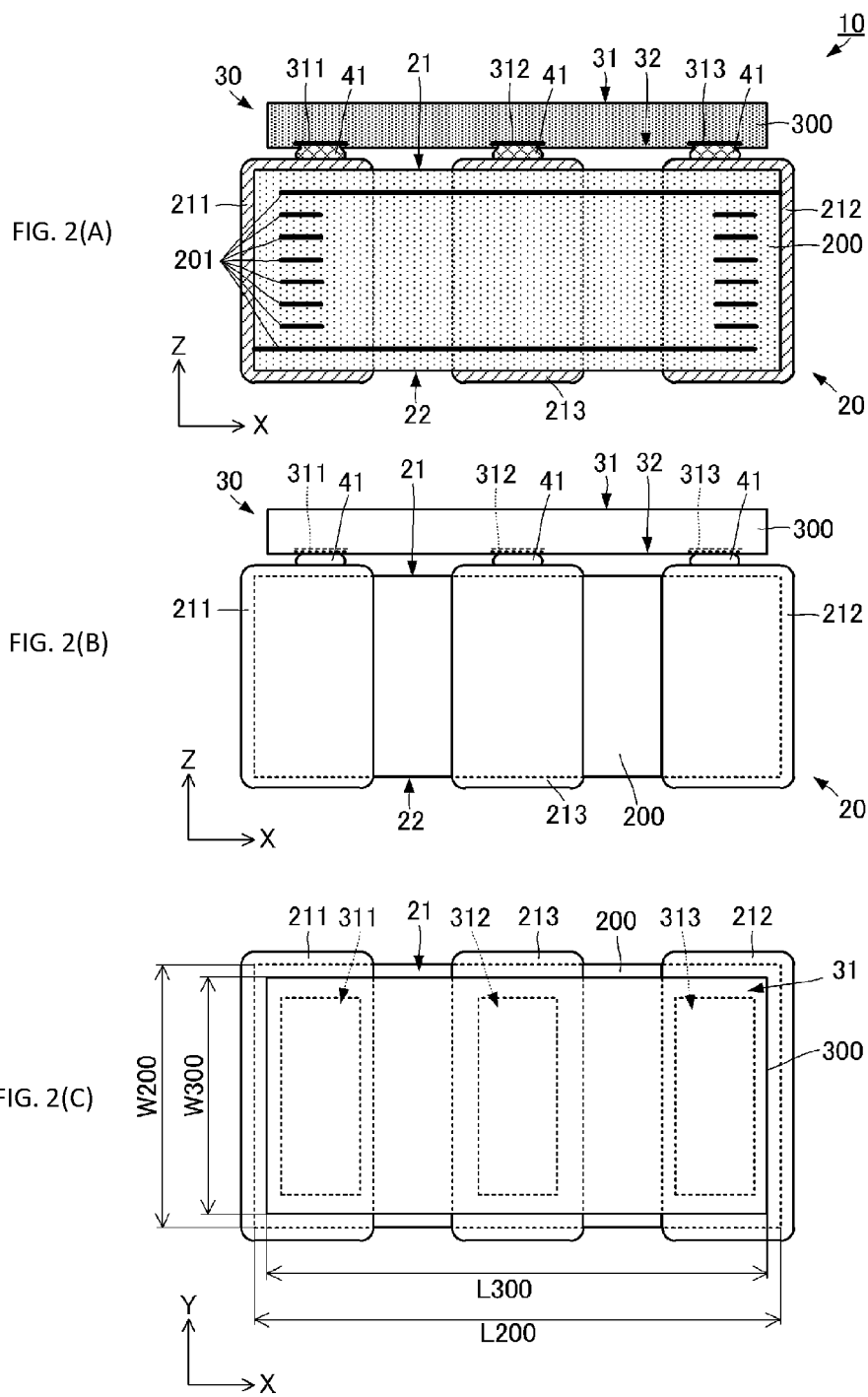
FIG. 2(A) is a side cross-sectional view of the ESD-protective surface-mount composite component according to the first exemplary embodiment.
FIG. 2(B) is a side view of the ESD-protective surface-mount composite component.
FIG. 2(C) is a plan view of the ESD-protective surface-mount composite component.

An ESD-protective surface-mount composite component according to a first exemplary embodiment will now be described with reference to the drawings. FIG. 1 is an external perspective view of the ESD-protective surface-mount composite component according to the first embodiment. FIG. 2(A) is a side cross-sectional view of the ESD-protective surface-mount composite component according to the first embodiment, FIG. 2(B) is a side view of the ESD-protective surface-mount composite component, and FIG. 2(C) is a plan view of the ESD-protective surface-mount composite component. Note that FIG. 2(A) illustrates a cross-section taken along line A-A in FIG. 1, but does not show the internal structure of a thin-film component 30.

As illustrated in FIGS. 1, 2(A), 2(B), and 2(C), an ESD-protective surface-mount composite component 10 includes a surface-mount inductor 20 and the thin-film component 30 coupled thereto.

As shown, the surface-mount inductor 20 includes a body 200, a first outer conductor 211, a second outer conductor 212, and a third outer conductor 213. The body 200 is made of a material containing a magnetic material. Inductor conductors are formed inside the body 200. The configuration of the body 200 will be detailed later on.

According to the exemplary aspect, the body 200 is in the shape of a rectangular parallelepiped. Specifically, as illustrated in FIG. 1, the body 200 has predetermined dimensions in three axis directions (X-direction, Y-direction, and Z-direction) orthogonal to each other. For example, the (dimension in X-direction)×(dimension in Y-direction) is about 1.0 (mm)×about 0.5 (mm) or about 0.6 (mm)×about 0.3 (mm). The dimension in the Z-axis is substantially equal to the dimension in the Y-direction. The X-direction corresponds to "first direction" of the present disclosure.

The body 200 has, at one end thereof in the Z-direction, a first surface 21 parallel to the X-direction and also has, at the other end thereof in the Z-direction, a second surface 22 parallel to the X-direction. The body 200 has, at one end thereof in the X-direction, a first end face 23 parallel to the Z-direction and also has, at the other end thereof in the X-direction, a second end face 24 parallel to the Z-direction. The body 200 also has, at both ends thereof in the Y-direction, side surfaces parallel to the X-direction.

The first outer conductor 211 is formed at a first end portion (i.e., a first end) of the body 200 in the X-direction. The first outer conductor 211 is shaped to cover the entire area of the first end face 23 and extend over part of each of the first surface 21, the second surface 22, and the side surfaces. The first outer conductor 211 is connected to one ends of the inductor conductors inside the body 200.

The second outer conductor 212 is formed at a second end portion (i.e., a second end opposite the first end) of the body 200 in the X-direction. The second outer conductor 212 is shaped to cover the entire area of the second end face 24 and extend over part of each of the first surface 21, the second surface 22, and the side surfaces. The second outer conductor 212 is connected to the other ends of the inductor conductors inside the body 200. The second outer conductor 212 and the first outer conductor 211 are spaced apart.

The third outer conductor 213 is formed at an intermediate position (e.g., a middle or center portion) of the body 200 in the X-direction. The third outer conductor 213 is shaped to extend over the first surface 21, the second surface 22, and the side surfaces. The third outer conductor 213 is spaced from both the first outer conductor 211 and the second outer conductor 212.

As described above, the first outer conductor 211, the third outer conductor 213, and the second outer conductor 212 are arranged on the body 200 along the first direction and spaced apart from one another.

The thin-film component 30 includes a body 300, a first terminal conductor 311, a second terminal conductor 312, and a third terminal conductor 313.

The body 300 is a flat plate-like member and includes a semiconductor diode and a capacitor C therein. The semiconductor diode corresponds to "ESD protection element" of the present disclosure. The configuration of the body 300 will be detailed later on. According to an exemplary aspect, for example, the (dimension in X-direction)×(dimension in Y-direction) of the body 300 is about 0.95 (mm)×about 0.45 (mm) when the body 200 of the inductor 20 measures 1.0 (mm)×0.5 (mm), and the (dimension in X-direction)× (dimension in Y-direction) of the body 300 is about 0.55 (mm)×about 0.25 (mm) when the body 200 of the inductor 20 measures 0.6 (mm)×0.3 (mm).

The body 300 has a front surface 32 at one end thereof in the Z-direction (e.g., a side surface), and has a back surface 31 at the other end thereof in the Z-direction (e.g., another side surface). The first terminal conductor 311, the second terminal conductor 312, and the third terminal conductor 313 are formed to be exposed to the front surface 32 of the body 300. The first terminal conductor 311, the second terminal conductor 312, and the third terminal conductor 313 are arranged to be spaced apart along the X-direction. The first terminal conductor 311 is formed near a first end of the body 300 in the X-direction, the third terminal conductor 313 is formed near a second end of the body 300 in the X-direction, and the second terminal conductor 312 is formed at an intermediate position of the body 300 in the X-direction.

The first terminal conductor 311 is connected to a first end of an ESD protection element TVS formed by a semiconductor diode, and the second terminal conductor 312 is connected to a second end of the ESD protection element TVS. That is, the first terminal conductor 311 and the second terminal conductor 312 are electrically connected through the ESD protection element TVS. The second terminal conductor 312 is connected to a first counter electrode of the capacitor C, and the third terminal conductor 313 is connected to a second counter electrode of the capacitor C. That is, the second terminal conductor 312 and the third terminal conductor 313 are electrically connected through the capacitor C.

As illustrated in FIGS. 2(A) and 2(B), the thin-film component 30 is mounted on (i.e., coupled thereto) the first surface 21 of the inductor 20. Specifically, the first terminal conductor 311 of the thin-film component 30 and the first outer conductor 211 of the inductor 20 are connected, with a conductive joining material 41 interposed therebetween. The second terminal conductor 312 of the thin-film component 30 and the third outer conductor 213 of the inductor 20 are connected, with the conductive joining material 41 interposed therebetween. The third terminal conductor 313 of the thin-film component 30 and the second outer conductor 212 of the inductor 20 are connected, with the conductive joining material 41 interposed therebetween.

Figure 3:
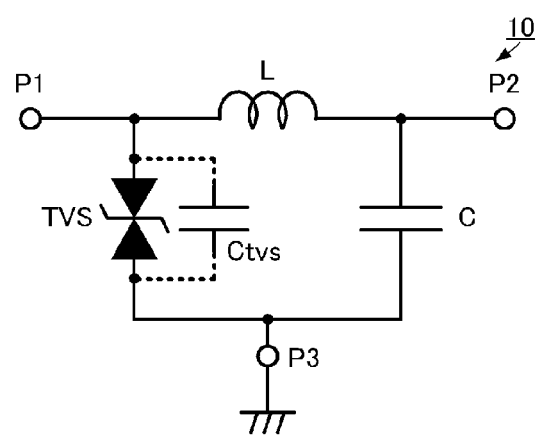
FIG. 3 is an equivalent circuit diagram of the ESD-protective surface-mount composite component according to the first exemplary embodiment.

With this configuration, the ESD-protective surface-mount composite component 10 provides a circuit such as that illustrated in FIG. 3. FIG. 3 is an equivalent circuit diagram of the ESD-protective surface-mount composite component according to the first embodiment of the present invention. As illustrated in FIG. 3, the ESD-protective surface-mount composite component 10 includes an inductor L, the ESD protection element TVS, and the capacitor C. The ESD-protective surface-mount composite component 10 also includes a first terminal P1, a second terminal P2, and a third terminal P3.

The inductor L is connected between the first terminal P1 and the second terminal P2. The ESD protection element TVS is connected between the first terminal P1 and the third terminal P3. The capacitor C is connected between the second terminal P2 and the third terminal P3. The ESD protection element TVS has a parasitic capacitor Ctvs, and the parasitic capacitor Ctvs is connected in parallel to the ESD protection element TVS in the equivalent circuit. The first terminal P1 and the second terminal P2 are terminals for inputting and outputting a high-frequency signal. The third terminal P3 is a terminal connected to the ground.

In this configuration, the ESD-protective surface-mount composite component 10 includes the ESD protection element TVS that connects a high-frequency signal transmission path to the ground. The ESD-protective surface-mount composite component 10 further includes a filter circuit (e.g., a low-pass filter) formed by the inductor L inserted in the high-frequency signal transmission path, the parasitic capacitor Ctvs connected between one end of the inductor and the ground, and the capacitor C connected between the other end of the inductor L and the ground.

With the configuration of the ESD-protective surface-mount composite component 10, the inductor L illustrated in FIG. 3 is realized by the inductor 20. In this case, the first outer conductor 211 serves as the first terminal P1 and the second outer conductor 212 serves as the second terminal P2. Also, the third outer conductor 213 serves as the third terminal P3. Additionally, the ESD protection element TVS and the capacitor C illustrated in FIG. 3 are realized by the thin-film component 30.

With the configuration described above, the ESD-protective surface-mount composite component 10 is provided in which the thin-film component 30 and the inductor 20 are directly joined together (i.e., joined without using a routing conductor and with, for example, the conductive joining material 41 interposed therebetween). This configuration eliminates the need to use a routing conductor to connect the thin-film component 30 and the inductor 20 and prevents negative impact of using a routing conductor on characteristics. Therefore, when the thin-film component 30 and the inductor 20 are formed to achieve desired characteristics, the ESD-protective surface-mount composite component 10 formed by the thin-film component 30 and the inductor 20 can easily achieve desired characteristics (e.g., filter characteristics, transmission characteristics, such as insertion loss characteristics).

As illustrated in FIG. 2(C), in plan view of the ESD-protective surface-mount composite component 10 (i.e., when viewed in a direction orthogonal to the first surface 21 of the body 200), the thin-film component 30 overlaps the inductor 20. As described above, a dimension L300 of the body 300 of the thin-film component 30 in the X-direction is smaller than a dimension L200 of the body 200 of the inductor 20 in the X-direction. Also, a dimension W300 of the body 300 of the thin-film component 30 in the Y-direction is smaller than a dimension W200 of the body 200 of the inductor 20 in the Y-direction.

Accordingly, the plane area of the ESD-protective surface-mount composite component 10 (i.e., corresponding to the area of mounting to the external circuit substrate) is equal to the plane area of the inductor 20. The ESD-protective surface-mount composite component 10 can thus be made smaller in size than an ESD protection circuit where the ESD protection element, the inductor, and the capacitor C are separate surface-mount components. That is, the ESD-protective surface-mount composite component 10 that can achieve desired characteristics can be realized in a compact size.

Figure 4A:
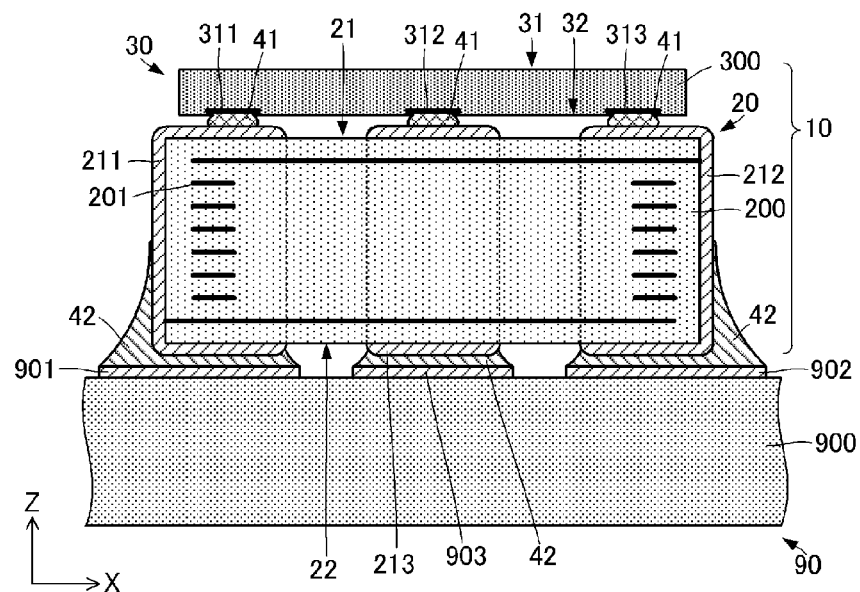
FIG. 4(A) is a side cross-sectional view illustrating how the ESD-protective surface-mount composite component according to the first exemplary embodiment is mounted on an external circuit substrate.
Figure 4B:
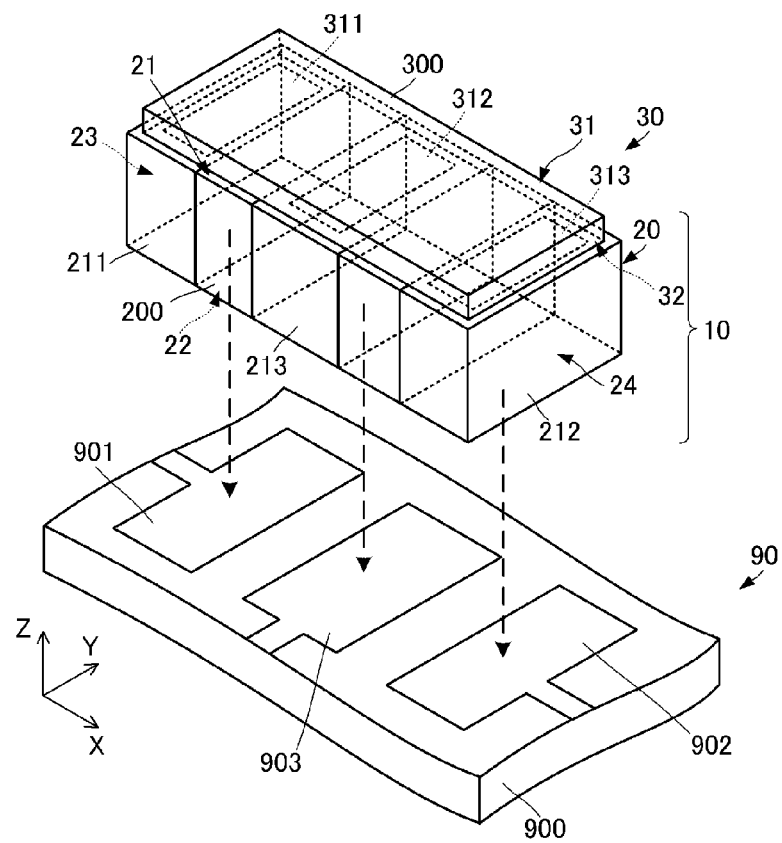
FIG. 4(B) is an external perspective view illustrating mounting onto the external circuit substrate.

The ESD-protective surface-mount composite component 10 configured as described above is mounted on an external circuit substrate, as illustrated in FIG. 4. FIG. 4(A) is a side cross-sectional view illustrating how the ESD-protective surface-mount composite component according to the first embodiment of the present invention is mounted on an external circuit substrate, and FIG. 4(B) is an external perspective view illustrating mounting onto the external circuit substrate. FIG. 4(A) shows the same cross-section as that taken along line A-A in FIG. 1.

An external circuit substrate 90 includes a substrate main body 900 and a plurality of land conductors 901, 902, and 903. The plurality of land conductors 901, 902, and 903 are arranged on the front surface of the substrate main body 900. The plurality of land conductors 901, 902, and 903 are spaced apart. The land conductors 901 and 902 are connected to an antenna and a high-frequency circuit, such as a transmitting and receiving circuit (not shown). The land conductor 903 is connected to a ground terminal (not shown).

The first outer conductor 211 of the inductor 20 is joined to the land conductor 901, with a conductive joining material 42 interposed therebetween, and the second outer conductor 212 of the inductor 20 is joined to the land conductor 902, with the conductive joining material 42 interposed therebetween. The third outer conductor 213 of the inductor 20 is joined to the land conductor 903, with the conductive joining material 42 interposed therebetween.

As described above, since the plane area of the ESD-protective surface-mount composite component 10 is equal to the plane area of the inductor 20, an area the ESD-protective surface-mount composite component 10 occupies on the front surface of the external circuit substrate 90 is small. That is, the ESD-protective surface-mount composite component 10 can be provided in a compact size (as compared with such conventional devices).

Figure 5:
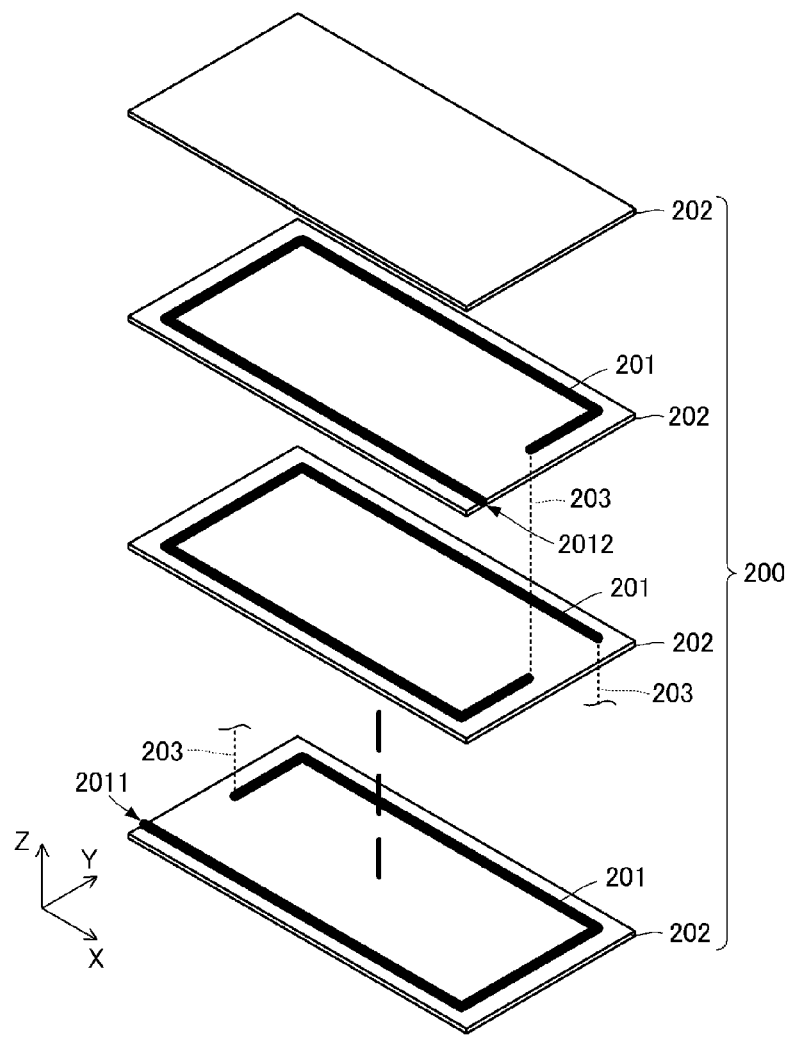
FIG. 5 is an exploded perspective view schematically illustrating a configuration of an inductor according to the first exemplary embodiment.

The configuration of the inductor 20 and the thin-film component 30 will now be detailed. FIG. 5 is an exploded perspective view schematically illustrating a configuration of the inductor according to the first embodiment of the present invention. A thick broken line in FIG. 5 indicates that at an intermediate position in the stacking direction, one or more magnetic layers stacked to form the inductor are not shown.

As illustrated in FIG. 5, the body 200 of the inductor 20 is formed by stacking a plurality of magnetic layers 202. Predetermined ones of the plurality of magnetic layers 202 have inductor conductors 201 formed thereon. Predetermined ones of the plurality of magnetic layers 202 are provided with interlayer connection conductors 203. Thus, the plurality of inductor conductors 201 and the plurality of interlayer connection conductors 203 form a helical conductor pattern having a winding axis extending in the stacking direction (Z-direction). The helical conductor pattern is connected at a first end 2011 thereof to the first outer conductor 211, and connected at a second end 2012 thereof to the second outer conductor 212.

When the inductor 20 with this configuration (i.e., the inductor 20 with a closed magnetic circuit) is used, the third outer conductor 213 formed on the outer surface of the body 200 is less likely to be coupled to an electric field generated by the inductor 20. Therefore, an undesired impact of this electric field on the characteristics of the ESD-protective surface-mount composite component 10 can be significantly reduced.

Figure 6:
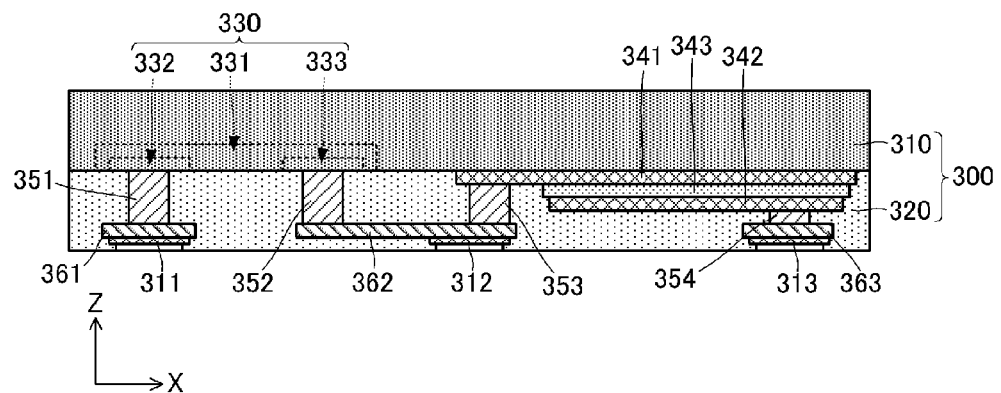
FIG. 6 is a cross-sectional view schematically illustrating a configuration of a thin-film component according to the first exemplary embodiment.

FIG. 6 is a cross-sectional view schematically illustrating a configuration of the thin-film component according to the first exemplary embodiment. It should be appreciated that the internal configuration of the thin-film component is so complex that it cannot be easily illustrated with a single cross-section. Thus, to avoid complexity and make the configuration of the thin-film component easy to understand, the cross-sectional view of FIG. 6 roughly illustrates the configuration.

As illustrated in FIG. 6, the body 300 of the thin-film component 30 includes a semiconductor substrate 310 and a rewiring layer 320. The semiconductor substrate 310 includes, in an inner region on the front side thereof, an ESD protection element 330 serving as an ESD protection element. The ESD protection element 330 is a planar member with a predetermined depth. The ESD protection element 330 is formed using a known semiconductor process as would be appreciated to one skilled in the art. For example, the semiconductor substrate 310 is made of Si. An n-type semiconductor layer (n-type well) 331 with a predetermined depth is formed on the front side of the semiconductor substrate 310. The n-type semiconductor layer 331 includes two p-type semiconductor portions 332 and 333 spaced apart. The two p-type semiconductor portions 332 and 333 are exposed to the front surface of the semiconductor substrate 310. The exposed portions of the p-type semiconductor portions 332 and 333 serve as input and output terminals of the ESD protection element 330. With this configuration, two pn junction diodes are formed, which are connected at cathodes thereof and exposed at anodes thereof to the front surface of the semiconductor substrate 310. The ESD protection element 330 can thus be used as an ESD protection element. The front surface of the p-type semiconductor portion 332 corresponds to "first terminal" of the present disclosure, and the front surface of the p-type semiconductor portion 333 corresponds to "second terminal" of the present disclosure.

The rewiring layer 320 is formed by a plurality of insulating layers. A first counter electrode 341 and a second counter electrode 342 are formed in the rewiring layer 320. The first counter electrode 341 and the second counter electrode 342 face each other, with a dielectric layer 343 interposed therebetween. The first counter electrode 341, the second counter electrode 342, and the dielectric layer 343 form the capacitor C (i.e., corresponding to the capacitor C in FIG. 3). According to the exemplary aspect, the first counter electrode 341, the second counter electrode 342, and the dielectric layer 343 are arranged so as not to coincide in plan view of the thin-film component 30.

The p-type semiconductor portion 332 of the ESD protection element 330 is connected through a conductive contact hole 351 to a wiring conductor 361. The first terminal conductor 311 is formed on the front surface of the wiring conductor 361, and the first terminal conductor 311 is exposed to the front surface of the rewiring layer 320, that is, to the front surface 32 of the thin-film component 30. The exposed surface may be plated. For example, the exposed surface may be Au-plated over a Ni underlayer.

The p-type semiconductor portion 333 of the ESD protection element 330 is connected through a conductive contact hole 352 to a wiring conductor 362. The second terminal conductor 312 is formed on part of the front surface of the wiring conductor 362, and the second terminal conductor 312 is exposed to the front surface of the rewiring layer 320, that is, to the front surface 32 of the thin-film component 30. The exposed surface may be plated. For example, the exposed surface may be Au-plated over a Ni underlayer.

Moreover, the wiring conductor 362 and the first counter electrode 341 are connected through a conductive contact hole 353.

The second counter electrode 342 is connected through a conductive contact hole 354 to a wiring conductor 363. The third terminal conductor 313 is formed on the front surface of the wiring conductor 363, and the third terminal conductor 313 is exposed to the front surface of the rewiring layer 320, that is, to the front surface 32 of the thin-film component 30. The exposed surface may be plated. For example, the exposed surface may be Au-plated over a Ni underlayer.

Thus, with the ESD protection element 330 formed using the semiconductor process, floating capacitance can be reduced unlike with a varistor. This reduces undesired capacitance C produced by the ESD protection element 330 and makes it easier to achieve desired characteristics of the ESD-protective surface-mount composite component 10.

With the technique for forming the rewiring layer 320, the capacitor C is formed by the first counter electrode 341 and the second counter electrode 342 which are disposed close to each other, with the dielectric layer 343 interposed therebetween. A large capacitance can thus be achieved with a thin layer structure. That is, it is possible to make the thin-film component 30 thinner while achieving desired capacitance. This means that the ESD-protective surface-mount composite component 10 can be realized, which is thin (compared with conventional designs) but can achieve desired characteristics.

Figure 7:
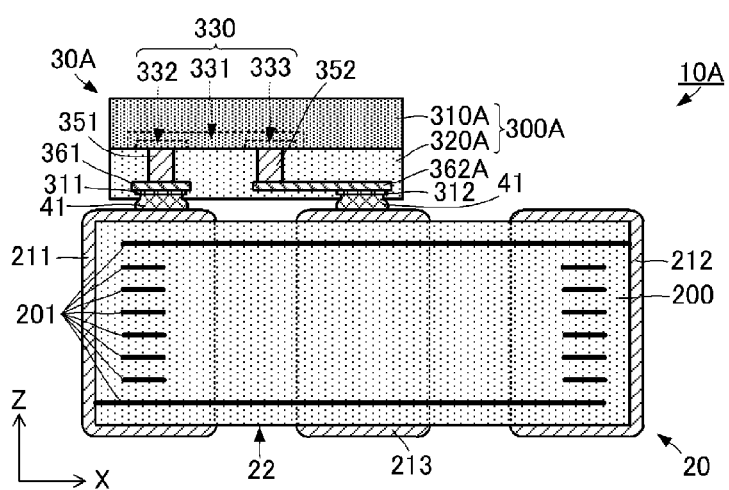
FIG. 7 is a side cross-sectional view of an ESD-protective surface-mount composite component according to a second exemplary embodiment.

An ESD-protective surface-mount composite component according to a second exemplary embodiment will now be described with reference to the drawings. FIG. 7 is a side cross-sectional view of an ESD-protective surface-mount composite component according to the second embodiment. It is again noted that the internal configuration of the ESD-protective surface-mount composite component is so complex that it cannot be easily illustrated with a single cross-section. Thus, to avoid complexity and make the configuration of the ESD-protective surface-mount composite component easy to understand, the cross-sectional view of FIG. 7 roughly illustrates the configuration.

As illustrated in FIG. 7, an ESD-protective surface-mount composite component 10A according to the present embodiment differs from the ESD-protective surface-mount composite component 10 of the first embodiment described above in the configuration of a thin-film component 30A. The other configurations of the ESD-protective surface-mount composite component 10A are the same as those of the ESD-protective surface-mount composite component 10, and description of the same portions will be omitted.

The thin-film component 30A differs from the thin-film component 30 of the first embodiment in that it does not have any portions that form the capacitor C. The thin-film component 30A includes a body 300A. The body 300A includes a semiconductor substrate 310A and a rewiring layer 320A. The ESD protection element 330 is formed on the front side of the semiconductor substrate 310A. The p-type semiconductor portion 332 of the ESD protection element 330 is connected through the conductive contact hole 351 to the wiring conductor 361. The first terminal conductor 311 is formed on the front surface of the wiring conductor 361, and the first terminal conductor 311 is exposed to the front surface of the rewiring layer 320A, that is, to the front surface 32 of the thin-film component 30A.

The p-type semiconductor portion 333 of the ESD protection element 330 is connected through the conductive contact hole 352 to a wiring conductor 362A. The second terminal conductor 312 is formed on part of the front surface of the wiring conductor 362A, and the second terminal conductor 312 is exposed to the front surface of the rewiring layer 320A, that is, to the front surface 32 of the thin-film component 30A.

As illustrated in FIG. 7, the dimension of the thin-film component 30A in the X-direction is substantially half the dimension of the inductor 20 in the X-direction, and specifically, is substantially equal to the length from the first outer conductor 211 to the third outer conductor 213 of the inductor 20 in the X-direction.

Figure 8:
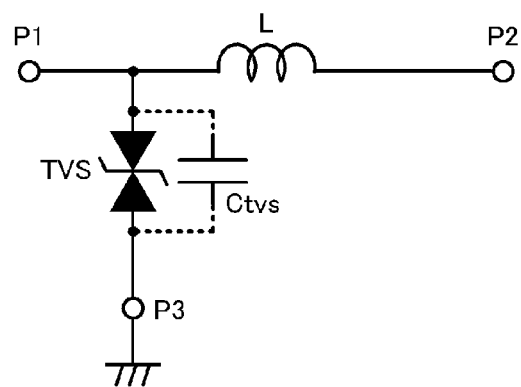
FIG. 8 is an equivalent circuit diagram of the ESD-protective surface-mount composite component according to the second exemplary embodiment.

The ESD-protective surface-mount composite component 10A with this configuration provides a circuit such as that illustrated in FIG. 8. FIG. 8 is an equivalent circuit diagram of the ESD-protective surface-mount composite component according to the second embodiment of the present invention. As illustrated in FIG. 8, the ESD-protective surface-mount composite component 10A includes the inductor L and the ESD protection element TVS. The ESD-protective surface-mount composite component 10A also includes the first terminal P1, the second terminal P2, and the third terminal P3.

According to the exemplary embodiment, the inductor L is connected between the first terminal P1 and the second terminal P2. The ESD protection element TVS is connected between the first terminal P1 and the third terminal P3. The ESD protection element TVS has the parasitic capacitor Ctvs, and the parasitic capacitor Ctvs is connected in parallel to the ESD protection element TVS in the equivalent circuit. The first terminal P1 and the second terminal P2 are terminals for inputting and outputting a high-frequency signal. The third terminal P3 is a terminal connected to the ground.

In this configuration, the ESD-protective surface-mount composite component 10A includes the ESD protection element TVS that connects a high-frequency signal transmission path to the ground. The ESD-protective surface-mount composite component 10A further includes a filter circuit (low-pass filter) formed by the inductor L inserted in the high-frequency signal transmission path and the parasitic capacitor Ctvs connected between one end of the inductor and the ground.

Like the ESD-protective surface-mount composite component 10 according to the first embodiment, the ESD-protective surface-mount composite component 10A of the present embodiment provides an ESD protection circuit with a filter function and has the same operation and effect as the ESD-protective surface-mount composite component 10 of the first embodiment.

Figure 9A:
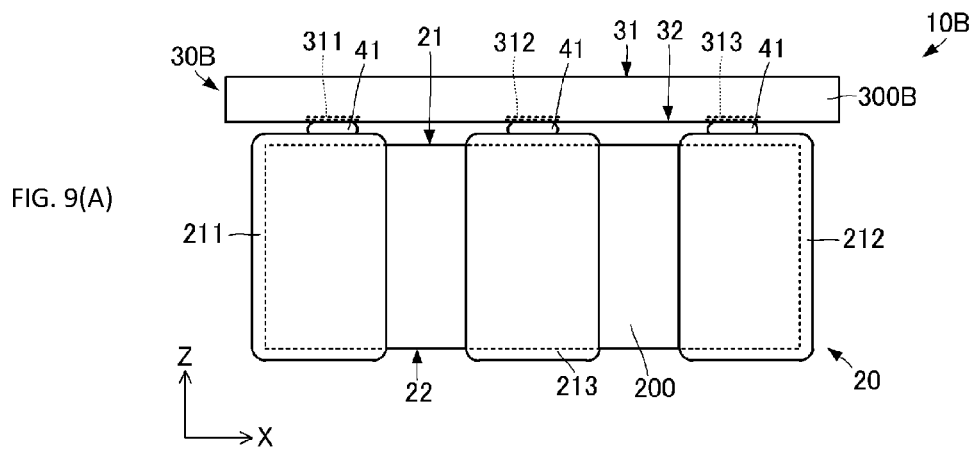
FIG. 9(A) is a side view of an ESD-protective surface-mount composite component according to a third exemplary embodiment.

An ESD-protective surface-mount composite component according to a third embodiment will now be described with reference to the drawings. FIG. 9(A) is a side view of an ESD-protective surface-mount composite component according to the third embodiment of the present invention, and FIG. 9(B) is a plan view of the ESD-protective surface-mount composite component.

Figure 9B:
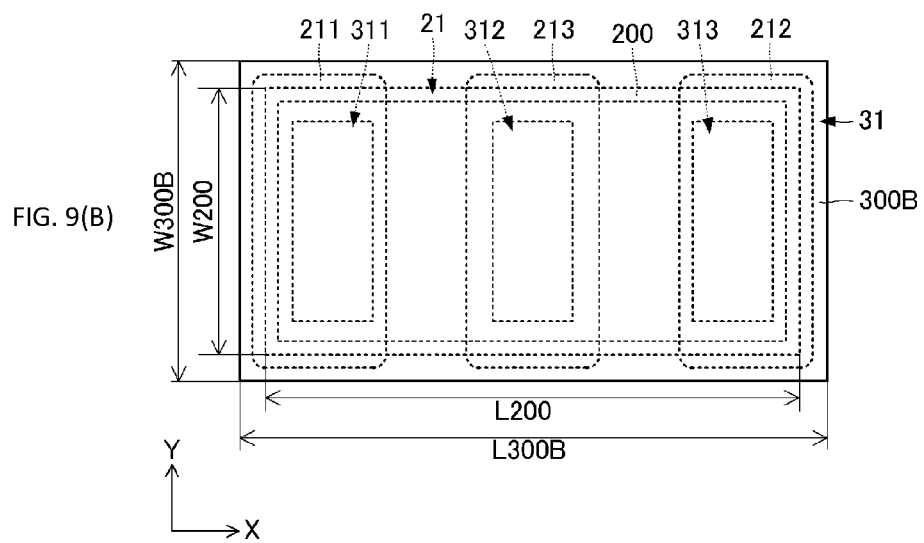
FIG. 9(B) is a plan view of the ESD-protective surface-mount composite component.

As illustrated in FIGS. 9(A) and 9(B), an ESD-protective surface-mount composite component 10B according to the present embodiment differs from the ESD-protective surface-mount composite component 10 of the first embodiment in dimensional relation between a thin-film component 30B and the inductor 20. The other configurations of the ESD-protective surface-mount composite component 10B are the same as those of the ESD-protective surface-mount composite component 10B, and description of the same portions will be omitted.

A dimension L300B of the thin-film component 30B in the X-direction is larger than the dimension L200 of the inductor 20 in the X-direction. A dimension W300B of the thin-film component 30B in the Y-direction is larger than the dimension W200 of the inductor 20 in the Y-direction. Accordingly, the plane area of the thin-film component 30B is larger than the plane area of the inductor 20. It is preferable here that the plane area of the thin-film component 30B be larger, within a predetermined range, than the plane area of the inductor 20. For example, the plane area of the thin-film component 30B is preferably less than or equal to about 1.2 times the plane area of the inductor 20. The relation between these plane areas may be set appropriately in accordance with the area allowable for the ESD-protective surface-mount composite component 10A.

Although having a plane area slightly larger than that of the ESD-protective surface-mount composite component 10 according to the first embodiment, the ESD-protective surface-mount composite component 10B configured as described above has the same operation and effect as the ESD-protective surface-mount composite component 10.

Figure 10:
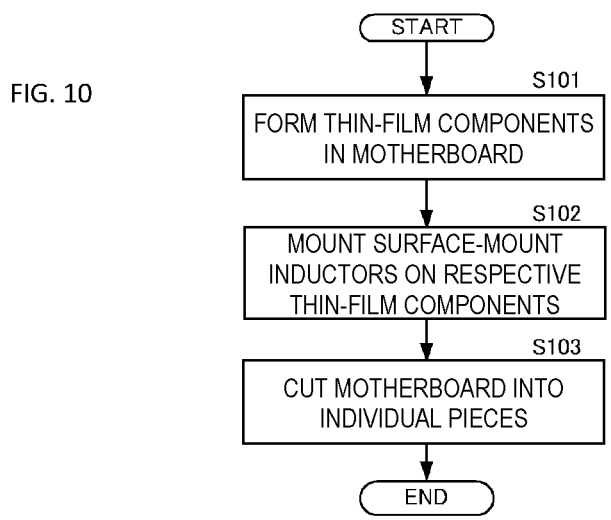
FIG. 10 is a flowchart outlining a process of manufacturing ESD-protective surface-mount composite components 10B according to the third exemplary embodiment.
Figure 11:
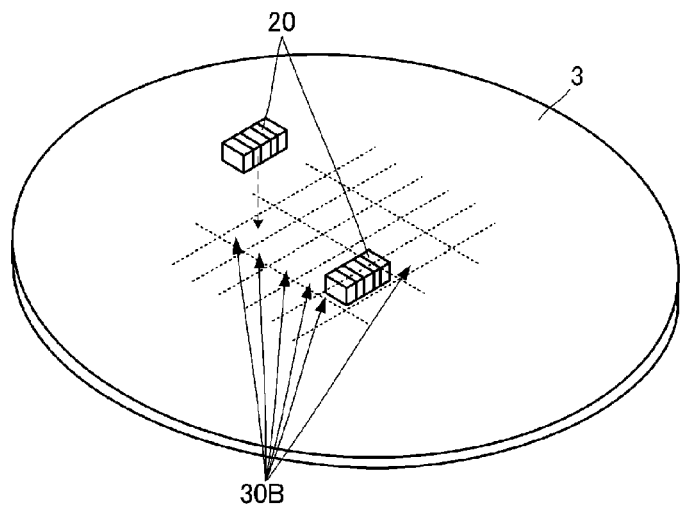
FIG. 11 schematically illustrates how surface-mount inductors are mounted on a motherboard.

The ESD-protective surface-mount composite component 10B can be manufactured by the manufacturing process described below. FIG. 10 is a flowchart outlining a process of manufacturing ESD-protective surface-mount composite components 10B according to the third embodiment. FIG. 11 schematically illustrates how surface-mount inductors are mounted on a motherboard.

First, a plurality of thin-film components 30B are formed in a motherboard 3 (S101). The thin-film components 30B are thus produced together.

Next, surface-mount inductors 20 are mounted on the respective thin-film components 30B in the motherboard 3 (S102). Since the plane area of the thin-film components 30B is larger than the plane area of the inductors 20, adjacent ones of the inductors 20 do not touch each other while being mounted. That is, the inductors 20 can be reliably mounted on the thin-film components 30B. In this step, an array of the ESD-protective surface-mount composite components 10B is formed in the motherboard 3.

Next, the motherboard 3 is cut into individual ESD-protective surface-mount composite components 10B (S103).

With the configuration of the present embodiment, the thin-film components 30B can be joined to the inductors 20 before being separated into individual pieces. This improves efficiency in producing the ESD-protective surface-mount composite components 10B.

Figure 12:
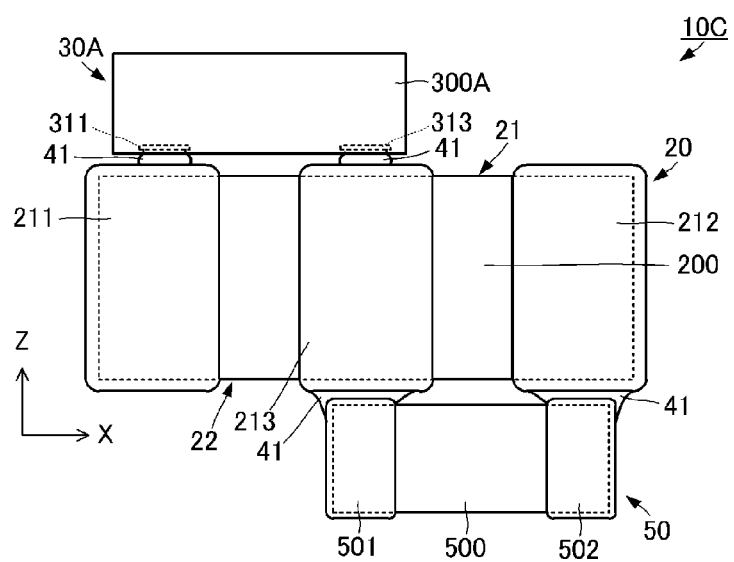
FIG. 12 is a side view of an ESD-protective surface-mount composite component according to a fourth exemplary embodiment.

An ESD-protective surface-mount composite component according to a fourth embodiment will now be described with reference to the drawings. FIG. 12 is a side view of an ESD-protective surface-mount composite component according to the fourth embodiment.

As illustrated in FIG. 12, an ESD-protective surface-mount composite component 10C according to the present embodiment differs from the ESD-protective surface-mount composite component 10A of the second embodiment in that it includes a surface-mount capacitor 50 added thereto. The other configurations of the ESD-protective surface-mount composite component 10C are the same as those of the ESD-protective surface-mount composite component 10A, and description of the same portions will be omitted.

The ESD-protective surface-mount composite component 10C includes the surface-mount inductor 20, the thin-film component 30A, and the surface-mount capacitor 50. It should be appreciated that the surface-mount capacitor 50 corresponds to the capacitor C in FIG. 3.

The capacitor 50 is mounted on the side of the second surface 22 of the inductor 20. That is, in the Z-direction, the capacitor 50 is disposed opposite the thin-film component 30A with respect to the inductor 20.

The capacitor 50 includes a dielectric body 500 and outer conductors 501 and 502. The capacitor 50 is a typical multilayer capacitor and its configuration will not be detailed. The dielectric body 500 includes a plurality of first counter electrodes and a plurality of second counter electrodes formed therein. The first counter electrodes and the second counter electrodes are alternately stacked. The first counter electrodes are connected to the outer conductor 501, and the second counter electrodes are connected to the outer conductor 502.

The outer conductor 501 is joined to the third outer conductor 213 of the inductor 20, with the conductive joining material 41 interposed therebetween. The outer conductor 502 is joined to the second outer conductor 212 of the inductor 20, with the conductive joining material 41 interposed therebetween.

With this configuration, the same circuit configuration as that of the ESD-protective surface-mount composite component 10 according to the first embodiment (i.e., the circuit configuration illustrated in FIG. 3) can be realized.

Figure 13:
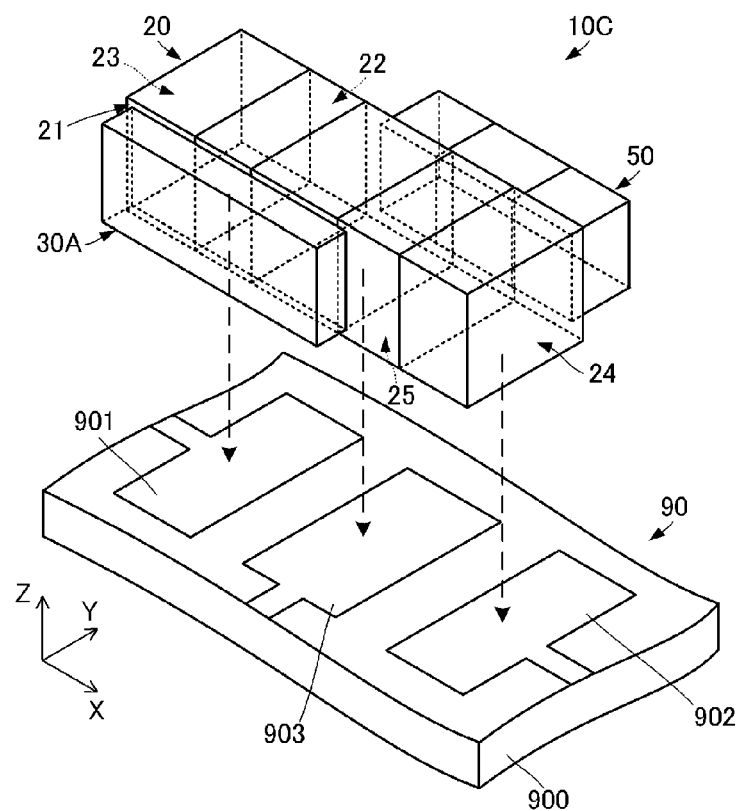
FIG. 13 is an external perspective view illustrating how the ESD-protective surface-mount composite component according to the fourth exemplary embodiment is mounted on the external circuit substrate.

As illustrated in FIG. 13, the ESD-protective surface-mount composite component 10C configured as described above is mounted on the external circuit substrate. FIG. 13 is an external perspective view illustrating how the ESD-protective surface-mount composite component according to the fourth embodiment is mounted on the external circuit substrate.

The ESD-protective surface-mount composite component 10C is mounted on the external circuit substrate 90, with a side surface 25 thereof orthogonal to the first surface 21 and the second surface 22 facing the front surface of the external circuit substrate 90.

In the embodiments described above, the thin-film component 30 is not limited to one that is formed by a semiconductor process, and may be one in which only an ESD protection element is formed by a semiconductor process and the ESD protection element is covered with insulating resin.

REFERENCE SIGNS LIST

3: motherboard
10, 10A, 10B, 10C: surface-mount composite component
20: inductor
21: first surface
22: second surface
23: first end face
24: second end face
25: side surface
30, 30A, 30B: thin-film component
31: back surface
32: front surface
41, 42: conductive joining material
50: capacitor
90: external circuit substrate
200: body
201: inductor conductor
202: magnetic layer
203: interlayer connection conductor
211: first outer conductor
212: second outer conductor
213: third outer conductor
300, 300A: body
310: semiconductor substrate
310A: semiconductor substrate
311: first terminal conductor
312: second terminal conductor 313: third terminal conductor
320, 320A: rewiring layer
330: ESD protection element
331: n-type semiconductor layer
332, 333: p-type semiconductor portion
341: first counter electrode
342: second counter electrode
343: dielectric layer
351, 352, 353, 354: contact hole
361, 362, 362A, 363: wiring conductor
500: dielectric body
501, 502: outer conductor
900: substrate main body
901, 902, 903: land conductor
2011: first end
2012: second end
P1: first terminal
P2: second terminal
P3: third terminal

The invention claimed is:

1. An ESD-protective surface-mount composite component comprising:
   a surface-mount inductor with a body having an inductor conductor disposed therein, with first and second outer conductors coupled to the inductor conductor and disposed on opposing ends of the body in a first direction, and a third outer conductor disposed at an intermediate position of the body in the first direction; and
   a thin-film component including a flat plate-like body, an ESD protection element disposed therein, a first terminal conductor connected to a first terminal of the ESD protection element and disposed on a front surface of the flat plate-like body, and a second terminal conductor connected to a second terminal of the ESD protection element and disposed on the front surface of the flat plate-like body,
   wherein the thin-film component is coupled on a first surface of the body of the surface-mount inductor, such that the first terminal conductor is connected to the first outer conductor and the second terminal conductor is connected to the third outer conductor.

2. The ESD-protective surface-mount composite component according to claim 1, wherein the surface-mount inductor includes a rectangular-parallelepiped-shaped body, and the thin-film component is coupled to the first surface of the rectangular-parallelepiped-shaped body parallel to the first direction.

3. The ESD-protective surface-mount composite component according to claim 1, wherein a parasitic capacitor of the ESD protection element and the inductor conductor of the surface-mount inductor form a filter.

4. The ESD-protective surface-mount composite component according to claim 1, wherein the thin-film component includes:
   a capacitor disposed inside the flat plate-like body, and
   a third terminal conductor disposed on the front surface of the flat plate-like body and connected to the capacitor.

5. The ESD-protective surface-mount composite component according to claim 4,
   wherein a first counter electrode of the capacitor is connected to the second terminal conductor, and a second counter electrode of the capacitor is connected to the third terminal conductor.

6. The ESD-protective surface-mount composite component according to claim 5, wherein the third terminal conductor is mounted on the second outer conductor of the surface-mount inductor.

7. The ESD-protective surface-mount composite component according to claim 6, wherein the capacitor, a parasitic capacitor of the ESD protection element, and the inductor conductor of the surface-mount inductor form a filter.

8. The ESD-protective surface-mount composite component according to claim 1, wherein a surface area of the thin-film component facing the surface-mount inductor is smaller than a surface area of the first surface of the body of the surface-mount inductor.

9. The ESD-protective surface-mount composite component according to claim 8, wherein, the thin-film component overlaps the first surface of the body of the surface-mount inductor in a direction orthogonal to the first surface.

10. The ESD-protective surface-mount composite component according to claim 1, wherein a surface area of the thin-film component facing the surface-mount inductor is larger than a surface area of the first surface of the body of the surface-mount inductor.

11. The ESD-protective surface-mount composite component according to claim 10, wherein, the thin-film component overlaps the first surface of the body of the surface-mount inductor in a direction orthogonal to the first surface.

12. An ESD-protective surface-mount composite component comprising:
   a surface-mount inductor having first and second outer conductors coupled to an inductor disposed therein, and an intermediate outer conductor disposed between the first and second outer conductors; and
   a thin-film component comprising a substrate, a rewiring layer disposed on the substrate, and first and second terminal conductors disposed on an outer surface of the thin-film component,
   wherein an ESD protection element is formed in the substrate and has a first terminal connected to the first terminal conductor and a second terminal connected to the second terminal conductor,
   wherein the thin-film component is mounted to the surface-mount inductor, such that the first terminal conductor is connected to the first outer conductor and the second terminal conductor is connected to the intermediate outer conductor.

13. The ESD-protective surface-mount composite component according to claim 12, wherein a parasitic capacitor of the ESD protection element and the inductor of the surface-mount inductor form a filter.

14. The ESD-protective surface-mount composite component according to claim 12, wherein the thin-film component includes:
   a capacitor disposed inside the rewiring layer, and
   a third terminal conductor disposed on the outer surface of the thin-film component, such that the first, second and third terminal conductors are in a same plane relative to a thickness direction of the thin-film component.

15. The ESD-protective surface-mount composite component according to claim 14,
   wherein a first counter electrode of the capacitor is connected to the second terminal conductor, and a second counter electrode of the capacitor is connected to the third terminal conductor.

16. The ESD-protective surface-mount composite component according to claim 15, wherein the third terminal conductor is mounted on the second outer conductor of the surface-mount inductor.

17. The ESD-protective surface-mount composite component according to claim 16, wherein the capacitor, a parasitic capacitor of the ESD protection element, and the inductor collectively form a filter.

18. The ESD-protective surface-mount composite component according to claim 12,
wherein a surface area of the outer surface of the thin-film component is smaller than a surface area of a surface of the surface-mount inductor facing the outer surface of the thin-film component, and
wherein, the thin-film component overlaps the surface of the surface-mount inductor in a direction orthogonal to the outer surface of the thin-film component.

19. The ESD-protective surface-mount composite component according to claim 12,
wherein a surface area of the outer surface of the thin-film component is larger than a surface area of a surface of the surface-mount inductor facing the outer surface of the thin-film component, and
wherein, the thin-film component overlaps the surface of the surface-mount inductor in a direction orthogonal to the outer surface of the thin-film component.

20. The ESD-protective surface-mount composite component according to claim 12, wherein the surface-mount inductor includes a rectangular-parallelepiped-shaped body, and the thin-film component is mounted on an outer surface of the rectangular-parallelepiped-shaped body parallel thereto.

* * * * *